United States Patent [19]
Lee

[11] Patent Number: 5,192,937
[45] Date of Patent: Mar. 9, 1993

[54] RESISTANCE UNIT FOR MOTOR SPEED CONTROL

[75] Inventor: Woo Y. Lee, Seoul, Rep. of Korea

[73] Assignee: Dong A Electric Parts Co., Ltd., Kuri, Rep. of Korea

[21] Appl. No.: 809,871

[22] Filed: Dec. 18, 1991

[30] Foreign Application Priority Data

Dec. 24, 1990 [KR] Rep. of Korea ............... 90-20771

[51] Int. Cl.$^5$ ............................................. H01H 61/02
[52] U.S. Cl. .................................. 337/104; 337/105; 361/104
[58] Field of Search ............... 337/404, 405, 232, 104, 337/105; 361/104, 25, 26

[56] References Cited

U.S. PATENT DOCUMENTS

| | | |
|---|---|---|
| 2,790,049 | 4/1957 | McAlister ........................ 337/405 |
| 3,243,554 | 3/1966 | Malone ........................... 337/104 |
| 3,763,454 | 10/1973 | Zandonatti ...................... 337/404 |
| 5,084,691 | 1/1992 | Lester et al. ................... 337/232 |

*Primary Examiner*—Harold Broome
*Attorney, Agent, or Firm*—Morgan & Finnegan

[57] ABSTRACT

A resistance unit has a temperature fuse between a resistance and a terminal for deactivating a resistance circuit when the motor reaches the permissible maximum temperature.

The resistance unit having resistance connected in series with a plurality of terminals for controlling the speed of a motor comprises at least one temperature fuse electrically interposed between one of the terminals and one end of a corresponding one of the resistances for deactivating the resistance circuit when the resistance unit is overheated.

3 Claims, 2 Drawing Sheets

RESISTANCE UNIT FOR MOTOR SPEED CONTROL

BACKGROUND OF THE INVENTION

The present invention relates to a resistance unit for motor speed control, and more particularly to a resistance unit having a temperature fuse between a resistance and a terminal for breaking a resistance circuit when the motor reaches the permissible maximum temperature.

In a conventional motor speed control system, there is no means for protecting a motor from overheating due to overload, mechanical defects and so on. Accordingly, not only may the motor be damaged, but also the instruments associated therewith.

A prior art resistance circuit having a temperature fuse is set forth in Japanese patent unexamined publication no. 2-304829 in which the temperature fuse is electrically connected to an open portion of a resistance. However, this type resistance circuit has a drawback in that the temperature fuse is not rapidly activated under the predetermined melting temperature, and has a further disadvantage in that it sometimes can not completely deactivate the circuit.

SUMMARY OF THE INVENTION

Accordingly, a principal object of the present invention is to provide an improved resistance unit for motor speed control, which will eliminate the aforementioned defects, be able to rapidly deactivate a resistance circuit by means of a temperature fuse elastically connected between a resistance and a terminal when overheating of the resistance circuit takes place, thereby deenergizing the motor.

According to the present invention, a resistance unit having resistances connected in series with a plurality of terminals for controlling the speed of a motor comprises at least one temperature fuse electrically interposed between one of the terminals and one end of a corresponding one of the resistances for deactivating the resistance circuit when the resistance unit is overheated.

Other features and operations of the present invention will become apparent from the following detailed description of the invention when taken in conjunction with the accompanying drawings.

DETAILED DESCRIPTION OF THE PREFERRED EMBODIMENTS

Figure 1:
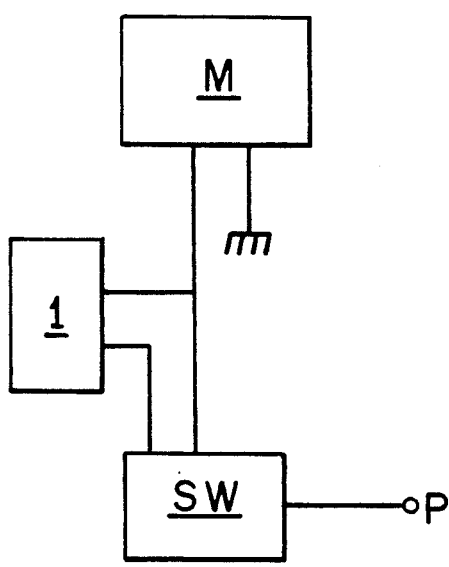
FIG. 1 is a block diagram illustrating the concept of a motor speed control system according to the present invention.
Figure 4:
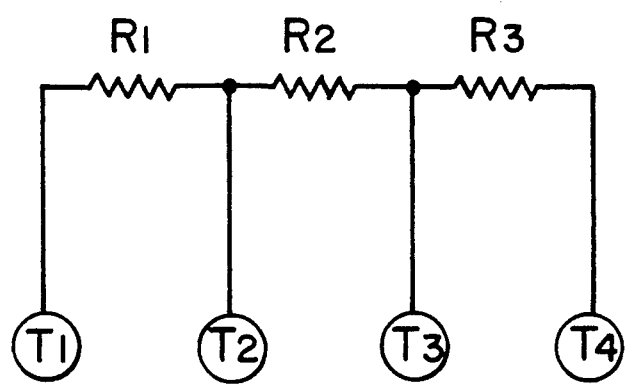
FIG. 4 is a resistance circuit diagram equivalent to FIG. 2.

The resistance unit(1) for motor speed control according to the present invention is, as shown in FIG. 1, interposed between a motor(M) and a switch(SW) for controlling the speed of the motor(M). In this embodiment, as illustrated in FIG. 4, the resistance unit(1) includes a high speed terminal($T_1$), a middle-high speed terminal($T_2$), a middle-low speed terminal($T_3$) and a low speed terminal($T_4$). The switch(SW). is electrically connected to a power supply(P). The speed of the motor is controlled by selecting one of the terminals under the control of the switch(SW).

Figure 2:
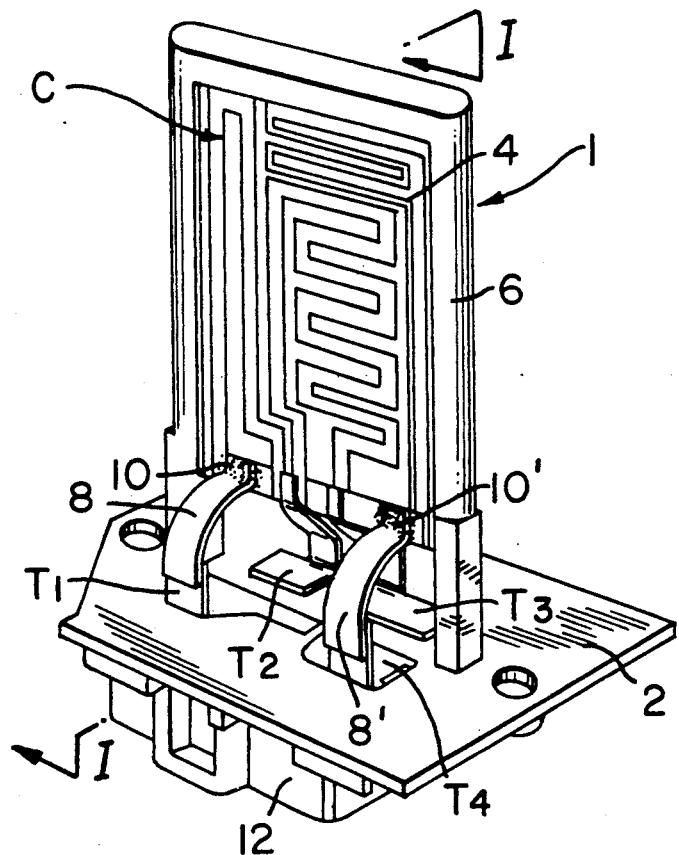
FIG. 2 is a perspective view of a resistance unit according to the present invention.
Figure 3:
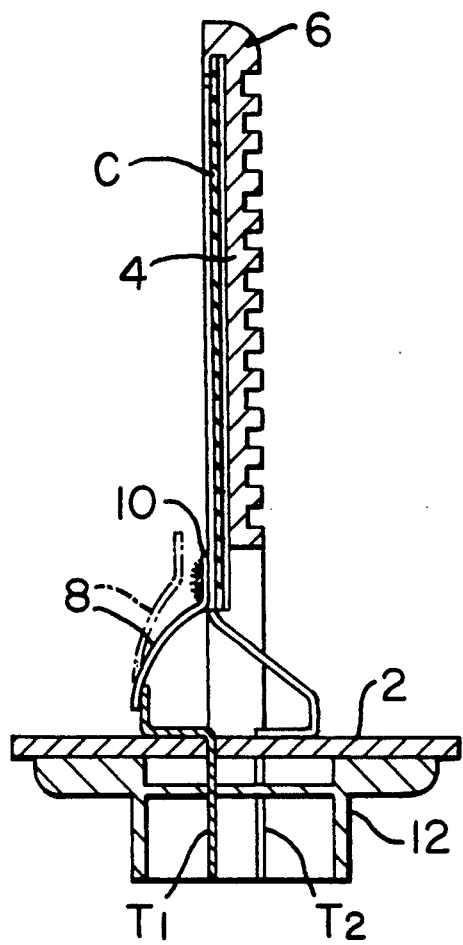
FIG. 3 is a sectional view taken along the line I—I in FIG. 2.

Referring to FIGS. 2 and 3, the preferred embodiment of the resistance unit for motor speed control according to the present invention is shown.

Resistance circuit C is formed by printing a predetermined pattern of resistances on one surface of substrate 4. The resistance circuit C has a plurality of resistances $R_1$, $R_2$, $R_3$, three in this embodiment as shown in FIG. 4, connected in series. Heat-proof plate 6 covers the other surface and the edges of the substrate 4. The heat-proof plate 6 is fitted onto board 2 projecting upwards from board 2.

A plurality of terminals $T_1$ to $T_4$ is fitted into the board 2. The opposite ends of each resistance $R_1$ to $R_3$ are electrically connected to the corresponding terminals $T_1$ to $T_4$. Temperature fuses 8, 8' are selectively interposed between the terminals and the resistances.

In this embodiment, terminals $T_1$ and $T_4$ are connected to the corresponding edges of the resistances through the temperature fuses 8 and 8'.

The temperature fuse 8 or 8' is formed of a spring for improving the activation of the fuse when the resistance unit 1 reaches the permissible maximum temperature. Both ends of each temperature fuse 8 or 8' are connected to the corresponding terminal $T_1$ or $T_4$ with its one end, and to the corresponding end of the resistance with its other end by soldering so as to form a breaking portion 10 or 10 which disconnects when the resistance unit 1 reaches the predetermined temperature. In this embodiment, the breaking portions 10, 10' melt at 80 degrees Celsius.

Numeral 12, is a housing for protecting the terminals $T_1$ to $T_4$.

During the operation of the motor, overheating thereof sometimes occurs due to overload, mechanical defects, etc. of the motor. The overheating affects the resistance unit connected to the motor. When the heat transmitted to the resistance unit reaches about 80 degrees Celsius, the breaking portions 10, 10' melt. Thus, one end of each temperature fuse 8, 8' rapidly springs forward from the resistance circuit as the dotted line of the temperature fuse shown in FIG. 3, thereby deactivating the resistance circuit.

As can be seen from the foregoing, the resistance unit for motor speed control according to the present invention, deenergizes the motor not only rapidly but also reliably when the resistance unit reaches the permissible maximum temperature.

While the invention has been illustrated and described with one embodiment, it is recognized that variations and changes can be made without departing from the scope and spirit of the invention as set forth in the claims.

What is claimed is:

1. A device for motor speed control comprising:
    a board having first and second surfaces suitable for mounting speed control components;
    a plurality of speed select terminals mounted on said first surface of said board and extending through to said second surface;
    a resistance unit including a plurality of resistors formed by imprinting resistive materials on a substrate, each resistor is connected in series to a corresponding speed select terminal for selectively varying the amount of current through said speed select terminal;

at least one heat sensitive fuse connected between one of said speed select terminals and one of said resistors for disconnecting said resistor from said terminal upon reaching a predetermined temperature;

a heat-proof plate for protecting the outer edges of said substrate, said plate being disposed substantially orthogonal to said board; and a housing mounted on said second surface of said board for protecting said extended portions of said speed select terminals.

2. A device according to claim 1, wherein said heat sensitive fuse is made of a spring, one end of said spring is soldered onto said resistor for opening said electrical connection between said resistor and said corresponding terminal upon said fuse reaching a predetermined temperature.

3. A device according to claim 2 wherein said predetermined temperature is about 80 degrees Celsius.

* * * * *